United States Patent
Wu et al.

(10) Patent No.: US 12,407,352 B2
(45) Date of Patent: Sep. 2, 2025

(54) SYNCHRONIZATION SIGNAL GENERATION CIRCUIT AND SYNCHRONIZATION METHOD BETWEEN MULTIPLE DEVICES

(71) Applicant: HTC Corporation, Taoyuan (TW)

(72) Inventors: Sheng-Long Wu, Taoyuan (TW); Wei-Chih Kuo, Taoyuan (TW); Shih-Yao Tsai, Taoyuan (TW); Li-Wei Lin, Taoyuan (TW); Chao Shuan Huang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 71 days.

(21) Appl. No.: 18/432,059

(22) Filed: Feb. 5, 2024

(65) Prior Publication Data
US 2024/0429922 A1 Dec. 26, 2024

Related U.S. Application Data

(60) Provisional application No. 63/509,031, filed on Jun. 20, 2023.

(51) Int. Cl.
*H03L 7/06* (2006.01)
*H03K 5/22* (2006.01)
*H03K 21/00* (2006.01)

(52) U.S. Cl.
CPC .......... *H03L 7/06* (2013.01); *H03K 5/22* (2013.01); *H03K 21/00* (2013.01)

(58) Field of Classification Search
CPC .............. G06F 1/32; G06F 9/44; H04L 7/06
See application file for complete search history.

(56) References Cited

U.S. PATENT DOCUMENTS

| 2011/0035632 A1* | 2/2011 | Hong ............ G06F 11/0763 |
| | | 714/E11.024 |
| 2025/0110527 A1* | 4/2025 | Hesson ............... G06F 1/10 |

FOREIGN PATENT DOCUMENTS

| TW | I442213 | 6/2014 |
| TW | 202311891 | 3/2023 |

OTHER PUBLICATIONS

"Office Action of Taiwan Counterpart Application", issued on Sep. 20, 2024, p. 1-p. 6.

* cited by examiner

*Primary Examiner* — Keshab R Pandey
(74) *Attorney, Agent, or Firm* — JCIPRNET

(57) ABSTRACT

A synchronization signal generation circuit and a synchronization method among a plurality of devices are proposed. The synchronization signal generation circuit includes a clock signal generator and a controller. The clock signal generator generates a reference clock signal. The controller receives an input clock signal from a host end device and generates a plurality of candidate clock signals through a plurality of counting operations based on the reference clock signal. The controller selectively transmits one of the candidate clock signals to each peripheral device according to request information corresponding to each peripheral device. The candidate clock signals and the input clock signal have mutually aligned start time points in each frame period.

17 Claims, 5 Drawing Sheets

SYNCHRONIZATION SIGNAL GENERATION CIRCUIT AND SYNCHRONIZATION METHOD BETWEEN MULTIPLE DEVICES

CROSS-REFERENCE TO RELATED APPLICATION

This application claims the priority benefit of U.S. provisional application Ser. No. 63/509,031, filed on Jun. 20, 2023. The entirety of the above-mentioned patent application is hereby incorporated by reference herein and made a part of this specification.

BACKGROUND

Technical Field

The disclosure relates to a synchronization signal generation circuit and a synchronization method among a plurality of devices, and particularly relates to a synchronization signal generation circuit used in an augmented reality display system and a synchronization method among a plurality of devices.

Description of Related Art

In the conventional technical field, an augmented reality display device includes a display and a plurality of sensing devices. The display and the sensing devices may perform tracking operations for a variety of objects. The display may be used as an output device and the sensing devices may be used as input devices. Since the display and the sensing devices may respectively perform operations based on different frame rates, it is difficult to synchronize the operations among the display and the plurality of sensing devices.

SUMMARY

The disclosure provides a synchronization signal generation circuit and a synchronization method among a plurality of devices, which may synchronize the plurality of devices working at different frame rates with each other.

A synchronization signal generation circuit of the disclosure includes a clock signal generator and a first controller. The clock signal generator generates a reference clock signal. The first controller is coupled among a host end device and a plurality of first peripheral devices, and receives an input clock signal from the host end device. The first controller generates a plurality of candidate clock signals through a plurality of counting operations based on the reference clock signal. The first controller selectively transmits one of the candidate clock signals to each first peripheral device according to the request information corresponding to each first peripheral device. The candidate clock signals and the input clock signal have mutually aligned start time points in each frame period.

A synchronization method among a plurality of devices of the disclosure includes the following steps. A clock signal generator is configured to generate a reference clock signal. A first controller is disposed among a host end device and a plurality of first peripheral devices. The first controller is configured to receive an input clock signal from the host end device, and the first controller is configured to generate a plurality of candidate clock signals through a plurality of counting operations based on the reference clock signal. The first controller is configured to selectively transmit one of the candidate clock signals to each first peripheral device according to request information corresponding to each first peripheral device, where the candidate clock signals and the input clock signal have mutually aligned start time points in each frame period.

Based on the above, in the synchronization signal generation circuit of the disclosure, the first controller performs the plurality of counting operations based on the reference clock signal to generate the plurality of candidate clock signals, and selects one of the candidate clock signals to transmit to each peripheral device so as to be used as a synchronization signal of the peripheral device according to the frame rate requirement of each peripheral device. The controller is configured to make the candidate clock signals and the input clock signal of the host end device have mutually aligned start time points in each frame period, and thereby make the operations among the host end device and the plurality of peripheral devices synchronize with each other.

DESCRIPTION OF THE EMBODIMENTS

Figure 1:
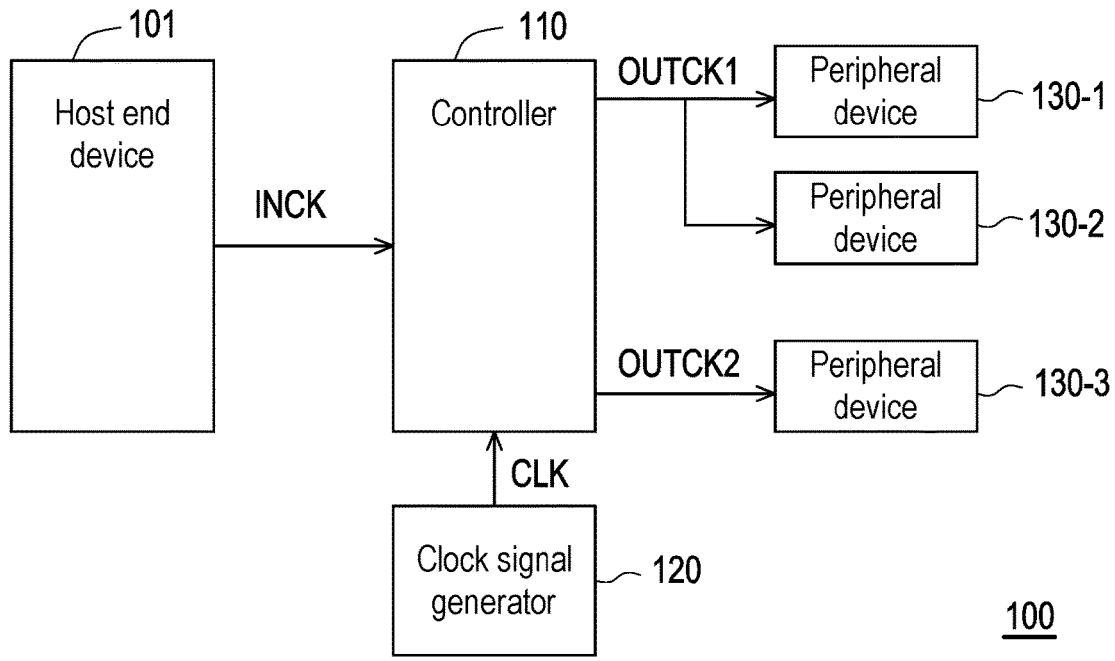
FIG. 1 is a schematic diagram of a synchronization signal generation circuit according to an embodiment of the disclosure.

Referring to FIG. 1, FIG. 1 is a schematic diagram of a synchronization signal generation circuit according to an embodiment of the disclosure. A synchronization signal generation circuit 100 includes a controller 110 and a clock signal generator 120. The controller 110 is coupled to the clock signal generator 120. The clock signal generator 120 is configured to generate a reference clock signal CLK and transmit the reference clock signal CLK to the controller 110. In the embodiment, the clock signal generator 120 is external to the controller 110.

On the other hand, the controller 110 is coupled to a host end device 101 and coupled to a plurality of peripheral devices 130-1 to 130-3. The controller 110 receives an input clock signal INCK transmitted by the host end device 101, where the input clock signal INCK may be a synchronization signal sent by the host end device 101. The controller 110 may generate a plurality of candidate clock signals through a plurality of counting operations based on the received reference clock signal CLK. Further, the controller 110 may selectively transmit one of the candidate clock signals to generate an output clock signal OUTCK1 according to the request information of the peripheral devices 130-1 and 130-2, and transmit the output clock signal OUTCK1 to the peripheral devices 130-1 and 130-2. The controller 110 may also selectively transmit one of the candidate clock signals to generate an output clock signal OUTCK2 according to the request information of the peripheral device 130-3, and transmit the output clock signal OUTCK2 to the peripheral device 130-3.

The request information of the peripheral devices 130-1, 130-2, and 130-3 is the frame rate at which the peripheral devices 130-1, 130-2, and 130-3 perform work. In the embodiment, the peripheral devices 130-1 and 130-2 may have the same working frame rate and receive the same output clock signal OUTCK1. The peripheral devices 130-1 and 130-2 receive the output clock signal OUTCK1 as the synchronization signal. In contrast, the working frame rate of the peripheral device 130-3 may be different from the working frame rate of the peripheral device 130-1, and the output clock signal OUTCK2 may be received as a synchronization signal. The output clock signals OUTCK2 and OUTCK1 may have different frequencies.

Based on the fact that the output clock signals OUTCK1 and OUTCK2 are both selected by the controller 110 from the plurality of candidate clock signals generated internally, the output clock signal OUTCK1 may be one of the candidate clock signals, and the output clock signal OUTCK2 may be another one of the candidate clock signals. In addition, the request information of the peripheral devices 130-1 to 130-3 does not need to be fixed, but may be dynamically adjusted. Taking the peripheral device 130-1 as an example, when the request information of the peripheral device 130-1 changes, the controller 110 may correspondingly select another candidate clock signal (having a different frequency than the output clock signal OUTCK1) other than the output clock signal OUTCK1 as the output clock signal, and transmit the output clock signal to the peripheral device 130-1 as a synchronization signal of the peripheral device 130-1.

It is worth mentioning that in order to synchronize the operations of the host end device 101 and the peripheral devices 130-1 to 130-3 with each other, the controller 110 may make the start time point of each candidate clock signal generated aligned with the start time point of the input clock signal INCK in each frame period.

Incidentally, in the embodiment, the host end device 101 may be an electronic device with a display. Furthermore, the host end device 101 may have a processor. The input clock signal INCK provided by the host end device 101 may be a synchronization signal for the display to perform display operations, such as a vertical synchronization signal. Each of the peripheral devices 130-1 to 130-3 may be a sensing element, such as a light sensor array and a light emitter array and/or a microelectromechanical system (MEMS).

Figure 2:
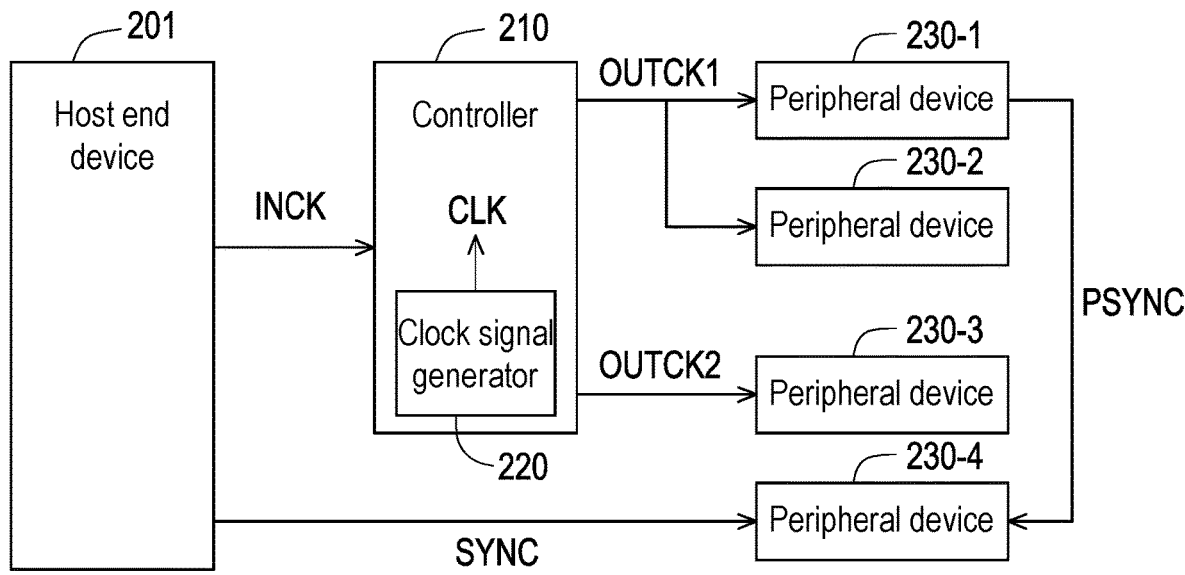
FIG. 2 is a schematic diagram of a synchronization signal generation circuit according to another embodiment of the disclosure.

Referring to FIG. 2 below, FIG. 2 is a schematic diagram of a synchronization signal generation circuit according to another embodiment of the disclosure. A synchronization signal generation circuit 200 includes a controller 210 and a clock signal generator 220. The controller 210 is coupled to the clock signal generator 220, wherein the clock signal generator 220 is embedded in the controller 210. The clock signal generator 220 is configured to generate the reference clock signal CLK inside the controller 210. In the embodiment, the controller 210 is coupled to a host end device 201 and is further coupled to peripheral devices 230-1 to 230-3. Peripheral device 230-4 may be directly coupled to the host end device 201. The controller 210 is the same as the controller 110 of the previous embodiment, and may generate and transmit the output clock signal OUTCK1 to the peripheral devices 230-1 and 230-2 according to the request information of the peripheral devices 230-1 to 230-3, and generate and transmit the output clock signal OUTCK2 to the peripheral device 230-3, so that the peripheral devices 230-1 to 230-3 may be configured to perform synchronization operations according to the received output clock signal OUTCK1 or OUTCK2.

Regarding the synchronization operations of the peripheral device 230-4, the host end device 201 may directly send a synchronization signal SYNC to the peripheral device 230-4, so that the peripheral device 230-4 may be configured to perform synchronization operations according to the synchronization signal SYNC. Furthermore, in the embodiment, the peripheral device 230-1 may also generate a post-synchronization signal PSYNC according to the received output clock signal OUTCK1. The peripheral device 230-1 may transmit the post-synchronization signal PSYNC to the peripheral device 230-4. In this way, the peripheral device 230-4 may perform synchronization operations according to the post-synchronization signal PSYNC and the synchronization signal SYNC.

For details about the generation of the candidate clock signals and the output clock signals OUTCK1 and OUTCK2 in the above-mentioned embodiments of FIG. 1 and FIG. 2, please refer to the following embodiments.

Figure 3:
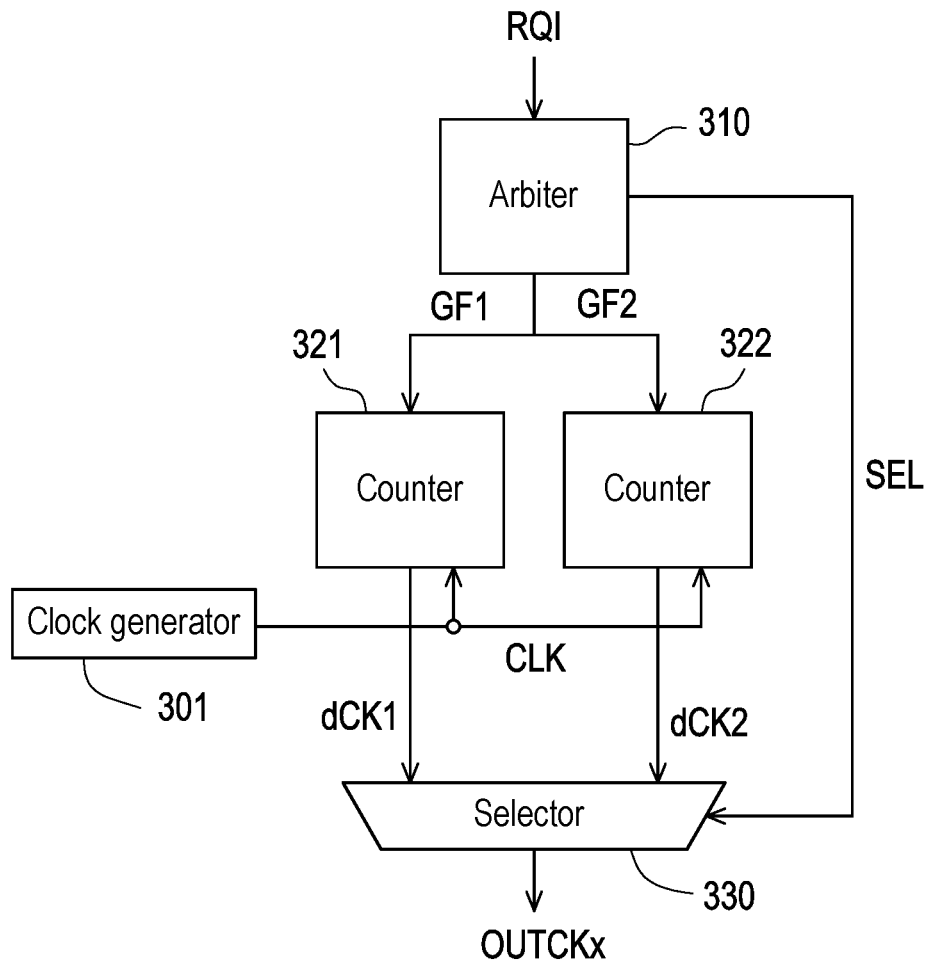
FIG. 3 is a schematic diagram of an implementation of a controller in a synchronization signal generation circuit according to an embodiment of the disclosure.

Referring to FIG. 3, FIG. 3 is a schematic diagram of an implementation of a controller in a synchronization signal generation circuit according to an embodiment of the disclosure. A controller 300 includes a clock generator 301. The clock generator 301 includes an arbiter 310, counters 321 and 322, and a selector 330. It is worth mentioning that one clock generator 301 may correspond to at least one peripheral device. When the controller 300 correspondingly controls a plurality of peripheral devices with different request information, a plurality of clock generators 301 may be disposed in the controller 300.

In the embodiment, the arbiter 310 is coupled to the counters 321 and 322 and the selector 330. The arbiter 310 receives a request information RQI of the corresponding peripheral device, and generates a selection signal SEL according to the request information RQI. The counters 321 and 322 receive the reference clock signal CLK generated by the clock generator 301, perform counting operations based on the reference clock signal CLK, and thereby generate candidate clock signals dCK1 and dCK2 respectively. The selector 330 is coupled to the counters 321 and 322 and the arbiter 310. The selector 330 selects one of the candidate clock signals dCK1 and dCK2 according to the selection signal SEL to generate an output clock signal OUTCKx.

In terms of operation details, the arbiter 310 is configured to decode the received request information RQI. The request information RQI includes the possible working frame rate of the corresponding peripheral device and the currently required working frame rate. In the embodiment, the arbiter 310 may decode the possible working frame rate in the request information RQI to generate a first target frequency GF1 and a second target frequency GF2. The arbiter 310 may also decode the currently required working frame rate in the request information RQI to generate the selection signal SEL.

The counters 321 and 322 receive the first target frequency GF1 and the second target frequency GF2 respectively. The counter 321 performs counting operations based on the reference clock signal CLK according to the first target frequency GF1, and thereby generates the candidate clock signal dCK1 with a frequency equal to the first target frequency GF1. It is worth mentioning that the reference clock signal CLK may be a signal with a relatively high frequency, such as millions or tens of millions of Hertz (Hz). The first target frequency GF1 may be a relatively low frequency, such as tens of Hertz. The counter 321 may generate the candidate clock signal dCK1 through the counting operations according to the multiple relationship between the frequency of the reference clock signal CLK and the first target frequency GF1. In the embodiment, the counter 321 may include a frequency dividing circuit.

The counter 322 performs counting operations based on a reference clock signal INCK according to the second target frequency GF2, and thereby generates the candidate clock signal dCK2 with a frequency equal to the second target frequency GF2. The counter 322 has similar circuit characteristics to the counter 321, which will not be described in detail here.

In the embodiment, the arbiter 310 may be a digital circuit. The counters 321 and 322 may be any form of counting circuits that are well known to those skilled in the art, which should not be construed as a limitation in the disclosure. The selector 330 may be any form of multiplexing circuits that are well known to those skilled in the art, which should neither be construed as a limitation in the disclosure.

Figure 4:
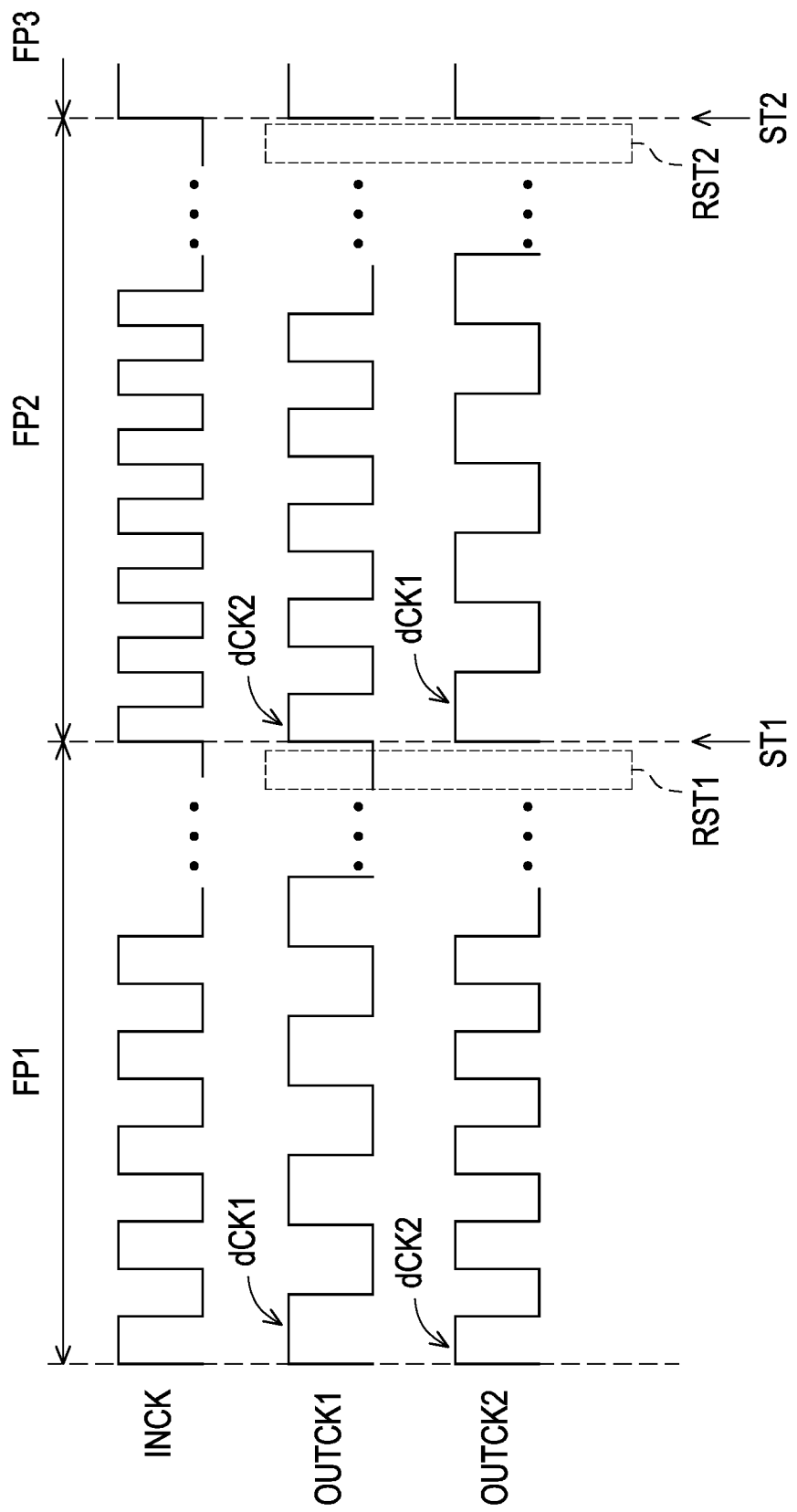
FIG. 4 is a waveform diagram of an input clock signal and an output clock signal according to an embodiment of the disclosure.

Referring to FIG. 4 below, FIG. 4 is a waveform diagram of an input clock signal and an output clock signal according to an embodiment of the disclosure. In FIG. 4, taking the frame rate of the host end device as 30 Hz as an example, the controller may learn start time points ST1 and ST2 of next frame periods FP2 and FP3 by counting the pulse wave number of the input clock signal INCK provided by the host end device in frame periods FP1 and FP2 respectively.

On the other hand, in the frame period FP1, the controller selects the candidate clock signal dCK1 to generate the output clock signal OUTCK1, selects the candidate clock signal dCK2 to generate the output clock signal OUTCK2, and taking the frequencies of the candidate clock signals dCK1 and dCK2 as 30 Hz and 20 Hz respectively, the counters in the controller (the counters 321 and 322 in FIG. 3) may count the pulse wave number of the candidate clock signals dCK1 and dCK2. When the pulse wave number of the candidate clock signal dCK1 reaches the first target value, the counter 321 may enter a reset interval RST1 and maintain the output clock signal OUTCK1 (equivalent to the candidate clock signal dCK1) at the state of the set logical value (e.g. logical value 0). Similarly, when the pulse wave number of the candidate clock signal dCK2 reaches the second target value, the counter 322 may enter the reset interval RST1 and maintain the output clock signal OUTCK2 (equivalent to the candidate clock signal dCK2) at the state of the set logical value (e.g., logical value 0).

The above-mentioned first target value and second target value may be determined according to the frequencies of the candidate clock signals dCK1 and dCK2 and the length of the frame period FP1. Taking the frame period FP1 as 1 second as an example, the first target value corresponding to the candidate clock signal dCK1 may be 20, and the second target value corresponding to the candidate clock signal dCK2 may be 30.

The controller maintains the output clock signals OUTCK1 and OUTCK2 at the logical value 0 in the reset interval RST1, and synchronously releases the reset state of the output clock signals OUTCK1 and OUTCK2 at the start time point ST1 of the frame period FP2, so that the output clock signals OUTCK1 and OUTCK2 may be configured to synchronously start the oscillation operation. In this way, the output clock signals OUTCK1 and OUTCK2 may achieve a synchronized state with the input clock signal INCK.

In the frame period FP2, based on the request information of the peripheral device, the controller switches to select the candidate clock signal dCK2 to generate the output clock signal OUTCK1, and selects the candidate clock signal dCK1 to generate the output clock signal OUTCK2. Similarly, the counters 321 and 322 generate a reset interval RST2 by counting the pulse wave number of the candidate clock signals dCK1 and dCK2 respectively in the frame period FP2, and maintain the output clock signals OUTCK1 and OUTCK2 at the logical value 0 in the reset interval RST2. Moreover, at the start time point ST2 of the frame period FP3, the output clock signals OUTCK1 and OUTCK2 may synchronously start the oscillation operation.

Figure 5:
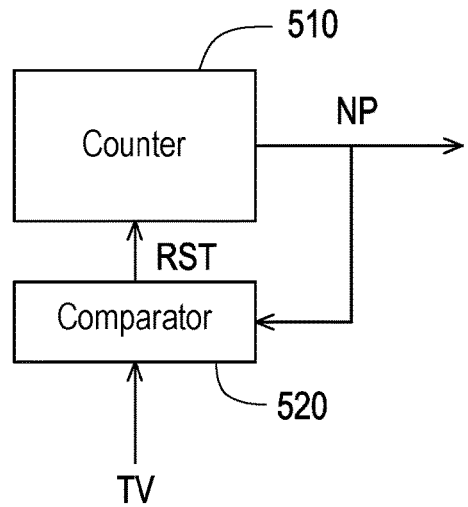
FIG. 5 is a schematic diagram of a partial circuit of a controller in a synchronization signal generation circuit according to an embodiment of the disclosure.

Referring to FIG. 5 below. FIG. 5 is a schematic diagram of a partial circuit of a controller in a synchronization signal generation circuit according to an embodiment of the disclosure. A counter 510 in the controller may be coupled to a comparator 520. The counter 510 may be any of the counters 321 and 322 in the embodiment of FIG. 3. The counter 510 may count a pulse wave number NP of the generated candidate clock signal, and the comparator 520 is configured to compare the pulse wave number NP with a corresponding target value TV. When the pulse wave number NP is equal to the corresponding target value TV, the comparator 520 may generate a reset signal RST to reset the counter 510 and maintain the candidate clock signal at the set logical value (e.g., logical value 0).

Figure 6:
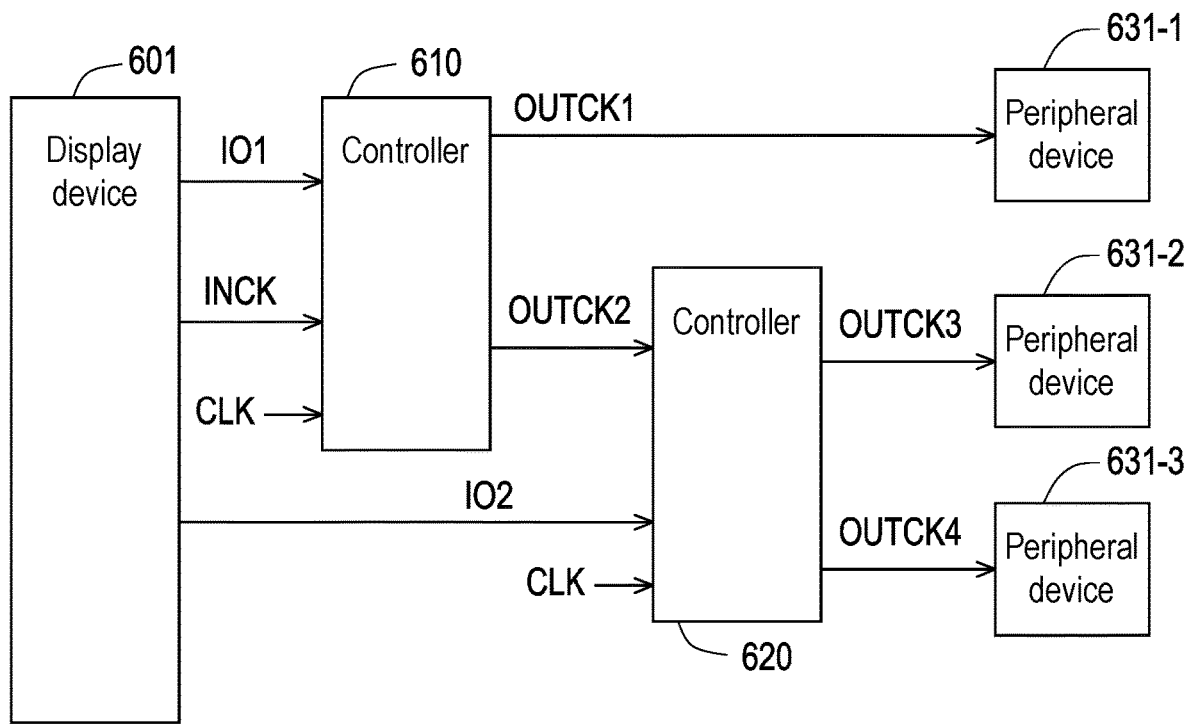
FIG. 6 is a schematic diagram of a synchronization signal generation circuit according to another embodiment of the disclosure.

Referring to FIG. 6, FIG. 6 is a schematic diagram of a synchronization signal generation circuit according to another embodiment of the disclosure. A synchronization signal generation circuit 600 includes controllers 610 and 620. The controllers 610 and 620 may receive the reference clock signal CLK generated by the clock signal generator (not shown). The controller 610 is coupled between a display device 601 as the host end device and a peripheral device 631-1. The controller 620 is coupled among the display device 601, the controller 610, and the peripheral devices 631-2 and 631-3.

The controller 610 may transmit and receive input and output data IO1 with the display device 601. The controller 610 may also receive the input clock signal INCK from the display device 610. The controller 610 may be configured to generate the plurality of candidate clock signals through the plurality of counting operations based on the reference clock signal CLK, selectively transmit one of the plurality of candidate clock signals as the output clock signal OUTCK1 according to the request information of the corresponding peripheral device 631-1, and transmit the output clock signal OUTCK1 to the peripheral device 631-1.

On the other hand, the controller 610 may select another one of the plurality of candidate clock signals to be the output clock signal OUTCK2, and transmit the output clock signal OUTCK2 to the controller 620. The controller 620 may have a similar circuit architecture as the controller 610. The controller 620 receives the output clock signal OUTCK2 as its input clock signal, and performs operations similar to the controller 610 to generate an output clock signal OUTCK3 and an output clock signal OUTCK4, and provide the output clock signal OUTCK3 and the output clock signal OUTCK4 to the corresponding peripheral devices 631-2 and 631-3 respectively.

In the embodiment, the controller 620 may serve as a relay circuit among the plurality of peripheral devices 631-2 and 631-3 and the controller 610, and by providing the output clock signal OUTCK3 and the output clock signal OUTCK4 to the corresponding peripheral devices 631-2 and 631-3, the peripheral devices 631-2 and 631-3 may be configured to perform synchronization operations according to the output clock signal OUTCK3 and the output clock signal OUTCK4 respectively.

In the embodiment, the details of the operations of the controllers 610 and 620 have been described in detail in the foregoing embodiments and implementation modes, and will not be described again here.

It is worth mentioning that in the embodiment, the controller 620 may be directly coupled to the display device 601, and may directly transmit and receive input and output data IO2 with the display device 601.

Figure 7:
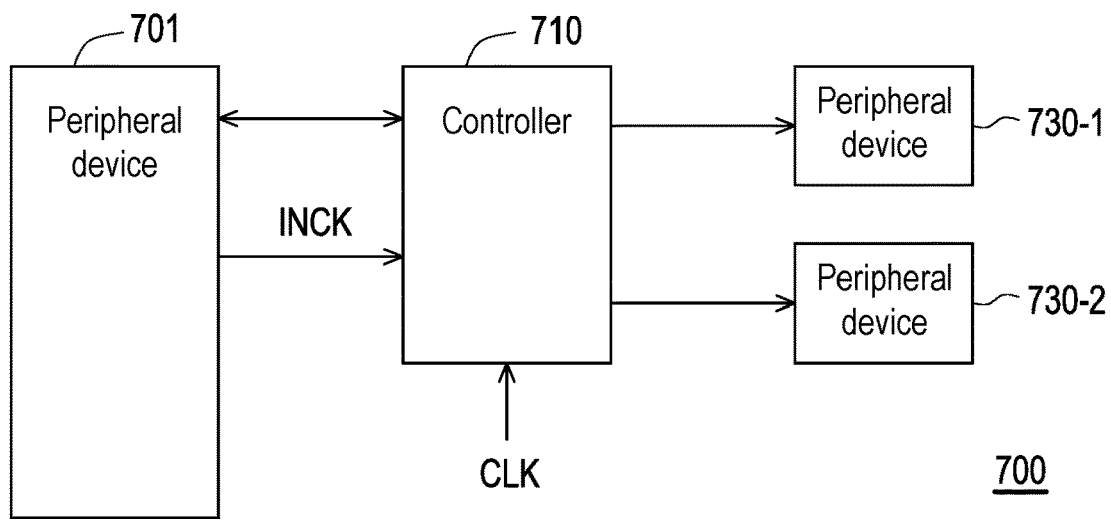
FIG. 7 is a schematic diagram of a synchronization signal generation circuit according to another embodiment of the disclosure.

Referring to FIG. 7, FIG. 7 is a schematic diagram of a synchronization signal generation circuit according to another embodiment of the disclosure. A synchronization signal generation circuit 700 includes a controller 710. In the embodiment, the host end device may be one of a plurality of peripheral devices. The controller 710 is coupled among peripheral device 701 and the peripheral devices 730-1 and 730-2. The controller 710 may receive the synchronization signal provided by the peripheral device 701 as the input clock signal INCK, and generate the output clock signals OUTCK1 and OUTCK2 based on the reference clock signal CLK. The controller 710 also provides the output clock signals OUTCK1 and OUTCK2 to the peripheral devices 730-1 and 730-2 respectively as the synchronization signals. In this way, the synchronization signal generation circuit 700 may perform synchronization operations among the peripheral devices 701, 730-1, and 730-2.

In the embodiment, the details of the operations of the controller 710 have been described in detail in the foregoing embodiments and implementation modes, and will not be described again here.

Figure 8:
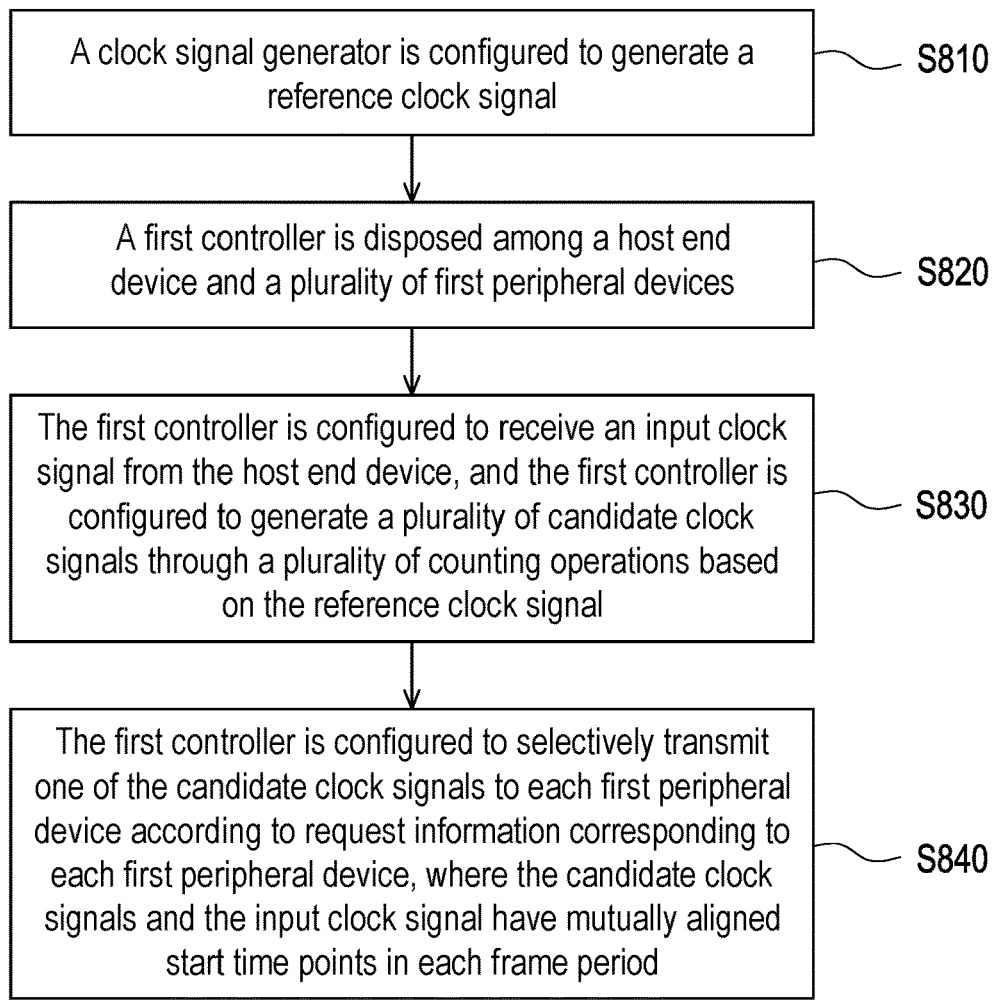
FIG. 8 is a flowchart of a synchronization method among a plurality of devices according to an embodiment of the disclosure.

Referring to FIG. 8, FIG. 8 is a flowchart of a synchronization method among a plurality of devices according to an embodiment of the disclosure. In step S810, the clock signal generator is configured to generate the reference clock signal; in step S820, the first controller is disposed among the host end device and the plurality of first peripheral devices; in step S830, the first controller is configured to receive the input clock signal from the host end device, and the first controller is configured to generate the plurality of candidate clock signals through a plurality of counting operations based on the reference clock signal; in step S840, the first controller is configured to selectively transmit one of the candidate clock signals to each first peripheral device according to the request information corresponding to each first peripheral device, where the candidate clock signals and the input clock signal have mutually aligned start time points in each frame period.

The implementation details of the above steps have been described in detail in the foregoing embodiments and implementation modes, and will not be described again here.

In summary, the synchronization signal generation circuit of the disclosure performs the plurality of counting operations through the first controller, and then selectively transmits one of the plurality of candidate clock signals to each first peripheral device according to the request information of the corresponding peripheral device as the synchronization signal for each first peripheral device. The key point is that the controller of the disclosure enables the candidate clock signals and the input clock signal provided by the host end device to have mutually aligned start time points in each frame period. In this way, the synchronization operations among the host end device and the plurality of peripheral devices may be effectively executed, thereby effectively improving the overall efficiency of the system.

What is claimed is:

1. A synchronization signal generation circuit, comprising:
   a clock signal generator, configured to generate a reference clock signal; and
   a first controller, coupled among a host end device and a plurality of first peripheral devices, wherein the host end device receives an input clock signal, the first controller generates a plurality of candidate clock signals through a plurality of counting operations based on the reference clock signal, and the first controller selectively transmits one of the candidate clock signals to each first peripheral device according to request information corresponding to each first peripheral device,
   wherein the candidate clock signals and the input clock signal have mutually aligned start time points in each frame period.

2. The synchronization signal generation circuit according to claim 1, wherein frequencies of the candidate clock signals are different.

3. The synchronization signal generation circuit according to claim 1, wherein each first peripheral device receives one of the candidate clock signals as a synchronization signal.

4. The synchronization signal generation circuit according to claim 1, wherein the first controller comprises
   a plurality of clock generators, corresponding to the first peripheral devices, wherein each clock generator generates the candidate clock signals of different frequencies according to the reference clock signal, each clock generator analyzes each request information to generate a selection signal, and one of the candidate clock signals is selected according to the selection signal to generate a corresponding output clock signal.

5. The synchronization signal generation circuit according to claim 4, wherein each clock generator comprises:
   an arbiter, configured to receive each request information and analyze each request information to generate each selection signal;
   a first counter, configured to receive the reference clock signal and generate a first candidate clock signal with a first frequency by performing a first counting operation based on the reference clock signal;
   a second counter, configured to receive the reference clock signal and generate a second candidate clock signal with a second frequency by performing a second counting operation based on the reference clock signal, wherein the first frequency and the second frequency are different; and
   a selector, coupled to the first counter, the second counter, and the arbiter, and configured to select the first candidate clock signal or the second candidate clock signal as the output clock signal according to the selection signal.

6. The synchronization signal generation circuit according to claim 5, wherein the clock generator further comprises:
   a first comparator, configured to compare a first target value with a first counting value of the first counter, wherein when the first target value is equal to the first counting value in each frame period, a first reset signal is generated to reset the first counter and maintain the first candidate clock signal at a set logical value; and a second comparator, configured to compare a second target value with a second counting value of the second counter, wherein when the second target value is equal to the second counting value in each frame period, a second reset signal is generated to reset the second counter and maintain the second candidate clock signal at the set logical value.

7. The synchronization signal generation circuit according to claim 1, further comprising:
a second controller, coupled to the first controller, wherein the first controller transmits a first clock signal of one of the candidate clock signals to the second controller, and the second controller selectively transmits one of a plurality of secondary candidate clock signals to at least one second peripheral device based on the first clock signal according to request information corresponding to the at least one second peripheral device.

8. The synchronization signal generation circuit according to claim 1, wherein the host end device is an electronic device with a display or a sensing element.

9. The synchronization signal generation circuit according to claim 1, wherein the host end device directly transmits a synchronization signal to a second peripheral device.

10. The synchronization signal generation circuit according to claim 1, wherein the first controller obtains the start time point of each frame period by counting the input clock signal.

11. The synchronization signal generation circuit according to claim 1, wherein the clock signal generator is embedded in the first controller, or the clock signal generator is external to the first controller.

12. A synchronization method among a plurality of devices, comprising:
configuring a clock signal generator to generate a reference clock signal;
disposing a first controller among a host end device and a plurality of first peripheral devices;
configuring the first controller to receive an input clock signal from the host end device, and configuring the first controller to generate a plurality of candidate clock signals through a plurality of counting operations based on the reference clock signal; and
configuring the first controller to selectively transmit one of the candidate clock signals to each first peripheral device according to request information corresponding to each first peripheral device,
wherein the candidate clock signals and the input clock signal have mutually aligned start time points in each frame period.

13. The synchronization method according to claim 12, wherein frequencies of the candidate clock signals are different.

14. The synchronization method according to claim 12, further comprising:
configuring each first peripheral device to receive one of the candidate clock signals as a synchronization signal.

15. The synchronization method according to claim 12, further comprising:
disposing a second controller after the first controller;
configuring the first controller to transmit a first clock signal of one of the candidate clock signals to the second controller; and
configuring the second controller to selectively transmit one of a plurality of secondary candidate clock signals to at least one second peripheral device based on the first clock signal according to request information corresponding to the at least one second peripheral device.

16. The synchronization method according to claim 12, further comprising:
configuring the host end device to directly transmit a synchronization signal to a second peripheral device.

17. The synchronization method according to claim 12, further comprising:
enabling the first controller to obtain the start time point of each frame period by counting the input clock signal.

\* \* \* \* \*